（12）United States Patent
Park et al.

(10) Patent No.: US 9,680,265 B2
(45) Date of Patent: Jun. 13, 2017

(54) FEMALE CONNECTOR AND METHOD FOR MANUFACTURING THE SAME

(71) Applicants: HYUNDAI MOTOR COMPANY, Seoul (KR); OPTO LINE CO., LTD., Hwaseong-si, Gyeonggi-do (KR)

(72) Inventors: Se Hoon Park, Yongin-si (KR); Cheol Hun Lee, Suwon-si (KR); Jin Sung Sa, Seoul (KR); Hyun Chung Ko, Anyang-si (KR)

(73) Assignees: HYUNDAI MOTOR COMPANY, Seoul (KR); OPTO LINE CO., LTD., Hwaseong-si, Gyeonggi-Do (KR)

( * ) Notice: Subject to any disclaimer, the term of this patent is extended or adjusted under 35 U.S.C. 154(b) by 0 days.

(21) Appl. No.: 14/795,544

(22) Filed: Jul. 9, 2015

(65) Prior Publication Data

US 2016/0156142 A1 Jun. 2, 2016

(30) Foreign Application Priority Data

Dec. 2, 2014 (KR) ........................ 10-2014-0170796

(51) Int. Cl.
*H01R 24/00* (2011.01)
*H01R 24/60* (2011.01)
*H05K 1/00* (2006.01)
*H01R 107/00* (2006.01)
*H01R 13/03* (2006.01)
*H01R 13/627* (2006.01)

(52) U.S. Cl.
CPC ............... *H01R 24/60* (2013.01); *H05K 1/00* (2013.01); *H01R 13/035* (2013.01); *H01R 13/6271* (2013.01); *H01R 2107/00* (2013.01); *Y10S 439/931* (2013.01)

(58) Field of Classification Search
USPC .................................. 439/629, 660, 886, 931
See application file for complete search history.

(56) References Cited

U.S. PATENT DOCUMENTS

| 4,662,702 | A | * | 5/1987 | Furuya | ..................... | H01R 13/03 |
| | | | | | | 439/630 |
| 5,599,595 | A | * | 2/1997 | McGinley | ............ | H01R 13/035 |
| | | | | | | 428/33 |
| 6,120,306 | A | * | 9/2000 | Evans | .................. | H01R 23/688 |
| | | | | | | 439/101 |

(Continued)

FOREIGN PATENT DOCUMENTS

| JP | H07-326414 | 12/1995 |
| JP | 2002-500811 | 1/2002 |

(Continued)

*Primary Examiner* — Tho D Ta
(74) *Attorney, Agent, or Firm* — Brinks Gilson & Lione

(57) ABSTRACT

The present disclosure relates to a female connector and a method for manufacturing the same. The female connector coupled with a male terminal unit in which a plurality of male terminals are arranged includes: a housing configured to have one side provided with a male insertion hole into which the male terminal unit is inserted and the other side provided with an insertion groove; a body configured to be inserted into the insertion groove to be coupled with the housing; and a female terminal configured to be formed on a surface of the body and provided with a pattern part electrically connected to the male connector by activating the surface by a laser.

6 Claims, 14 Drawing Sheets

(56) References Cited

U.S. PATENT DOCUMENTS

| | | | | |
|---|---|---|---|---|
| 8,834,183 B2* | 9/2014 | Komoto | ............ | H01R 12/71 |
| | | | | 439/507 |
| 2011/0275248 A1* | 11/2011 | Lee | ............ | H01R 24/64 |
| | | | | 439/660 |

FOREIGN PATENT DOCUMENTS

| JP | 2003-243112 A | 8/2003 |
|---|---|---|
| KR | 1992-0022593 | 12/1992 |
| KR | 10-1999-0036991 A | 5/1999 |
| KR | 20-0223696 | 3/2001 |
| KR | 10-2012-0002160 | 1/2012 |

\* cited by examiner

FEMALE CONNECTOR AND METHOD FOR MANUFACTURING THE SAME

CROSS-REFERENCE TO RELATED APPLICATION

This application claims the benefit of Korean Patent Application No. 10-2014-0170796, filed on Dec. 2, 2014, the entirety of which is hereby incorporated by reference.

FIELD

The present disclosure relates to a female connector and a method for manufacturing the same.

BACKGROUND

The statements in this section merely provide background information related to the present disclosure and may not constitute prior art.

Generally, a joint connector is used to connect wirings of a brake, a headlight, and the like of a vehicle. FIG. 1 is a diagram illustrating the joint connector. As illustrated in FIG. 1, the existing joint connector includes a housing 110 of a plastic material, a female terminal 130 coupled with one side of the housing 110 and made of a metal material, a side holder 120 for fixing the same, a cap 140, and a joint terminal 150.

The female terminal 130 is configured by separately compressing and assembling a plurality of female connectors and cables, respectively. A male terminal unit is inserted into the joint terminal 150 and is thus electrically connected thereto.

The existing joint connector is provided by a method for separately compressing and assembling the female connector and the cable, respectively, to form the female terminal 130 and then assembling the female terminal 130 with a housing 110 and a side holder 120. Therefore, an assembling time is long and thus personnel expenses increase, such that price competitiveness and productivity may be reduced.

SUMMARY

The present disclosure provides a female connector and a method for manufacturing the same capable of reducing the number of manufacturing processes, saving costs, reducing a weight and a size, and facilitating mass production.

According to an exemplary form of the present disclosure, a female connector coupled with a male terminal unit in which a plurality of male terminals are arranged, the female connector includes: a housing configured to have one side provided with a male insertion hole into which the male terminal unit is inserted and the other side provided with an insertion groove; a body configured to be inserted into the insertion groove to be coupled with the housing; and a female terminal configured to be formed on a surface of the body and provided with a pattern part electrically connected to the male connector by activating the surface by a laser.

The body of the female terminal may be made of a metal composite in which a portion decomposed by the laser has conductivity and a portion which is not decomposed by the laser has insulation.

A plurality of outer fastening holes may be penetratedly formed at a position adjacent to the male insertion hole of the housing, and the female terminal may further include an outer fastening member which protrudes from the body and is fastened with the outer fastening hole to fix the coupling with the housing.

An upper fastening hole may be penetratedly formed on the housing and the female terminal may further include an upper fastening member which protrudes from the body and is fastened with the upper fastening hole to fix the coupling with the housing.

The body of the female terminal may include: a main body extending along an insertion direction based on the insertion direction of the female terminal, and a wing body protruding to an outside from a front toward a rear based on the insertion direction, wherein a pattern part may be formed on the wing body.

The wing body may be provided to have an elastic force toward the outside.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
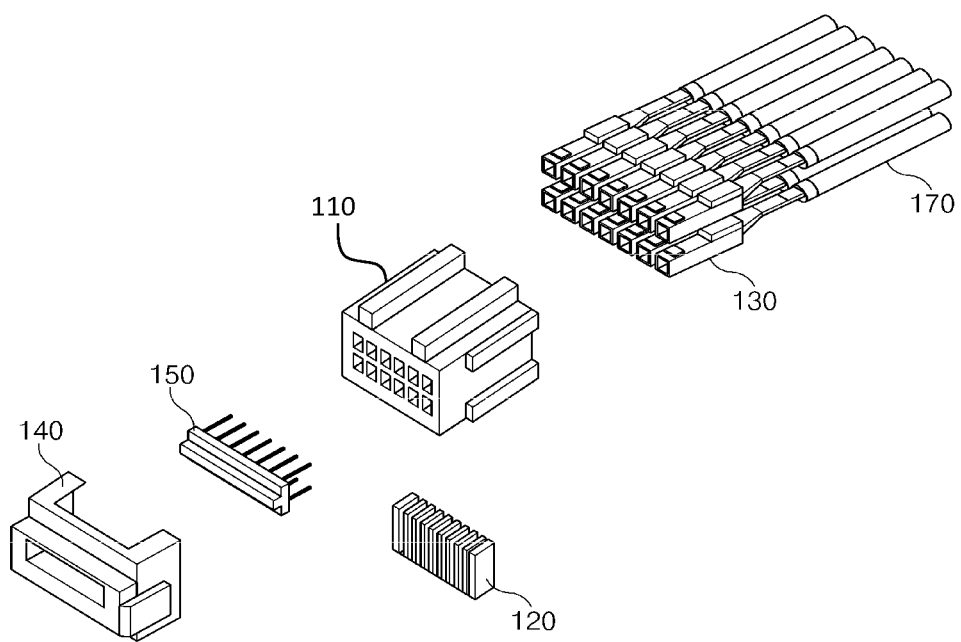
FIG. 1 is a diagram illustrating the existing joint connector.
Figure 2:
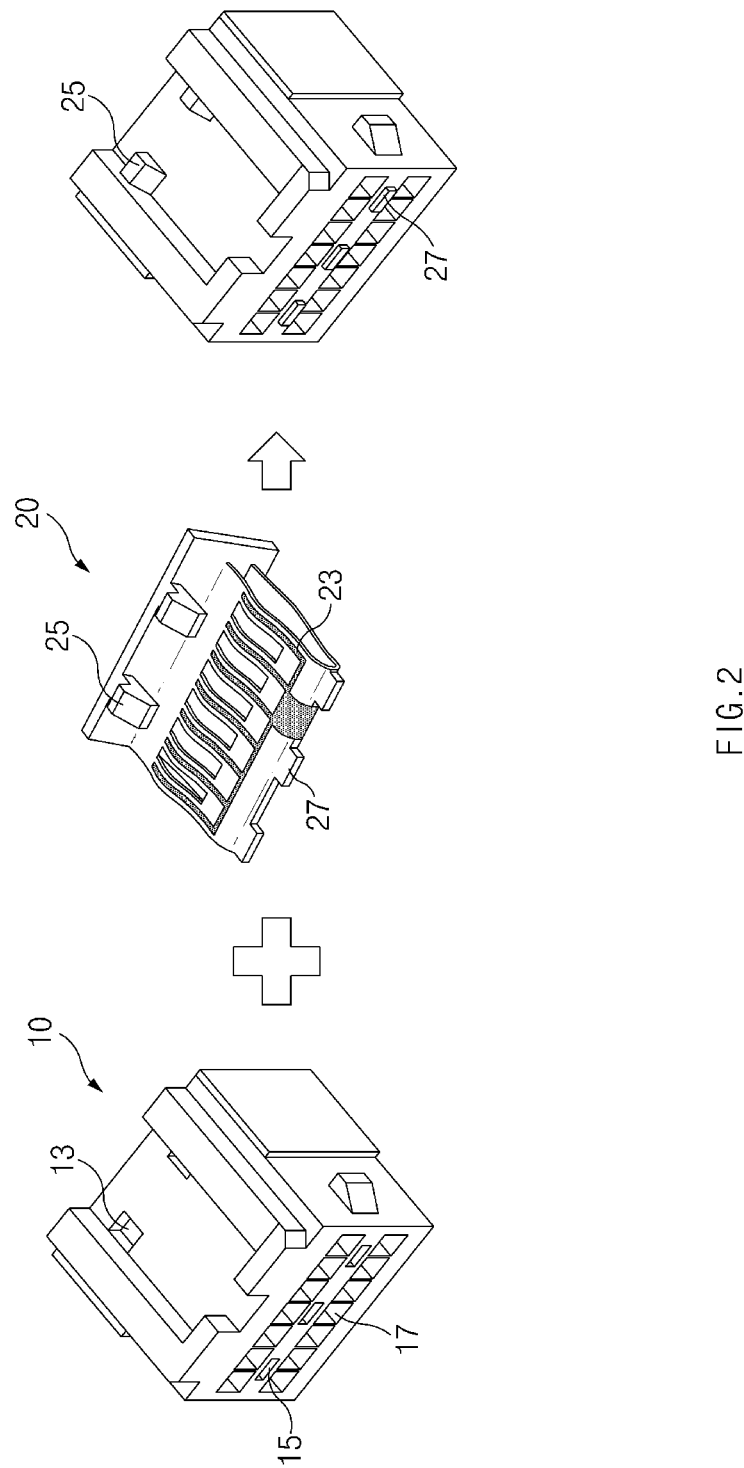
FIG. 2 is a diagram illustrating a female connector according to an exemplary form of the present disclosure.
Figure 3:
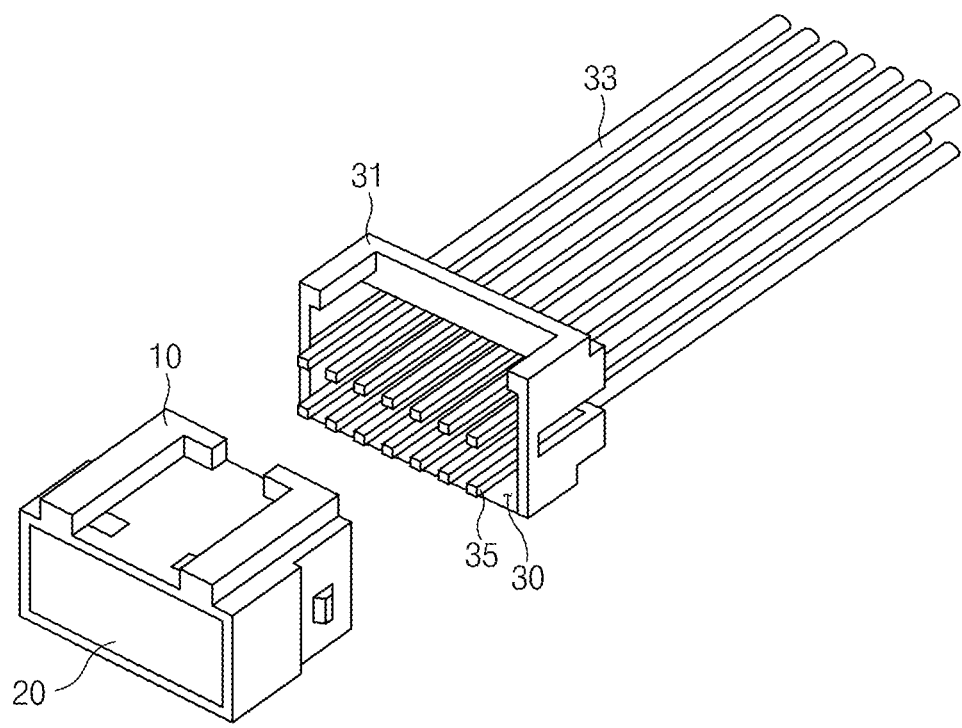
FIG. 3 is a diagram illustrating a coupling of the female connector according to the exemplary form of the present disclosure with a male terminal unit.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure relates to a female connector and a method for manufacturing the same. Therefore, the female connector according to the exemplary form of the present disclosure will be first described and then the method for manufacturing the same will be described.

<Female Connector>

As illustrated in FIGS. 3 to 11, according to an exemplary form of the present disclosure, a female connector coupled with a male terminal unit 30 in which a plurality of male terminals 35 are arranged includes a housing 10 having one side provided with a male insertion hole 17 into which the male terminal unit 30 is inserted and the other side provided with an insertion groove 11 into which a female terminal 20 to be inserted. The female terminal 20 is provided with a pattern part 23.

One side of the housing 10 is provided with the male insertion hole 17 into which the male terminal 35 is inserted and the other side thereof is provided with the insertion groove 11 into which the female terminal 20 is inserted. Further, the housing 10 is provided with an outer fastening hole 15 and an upper fastening hole 13 for fixing the coupling with the female terminal 20 inserted through the insertion groove 11.

The male insertion hole 17 formed at one side of the housing 10 is holes into which the plurality of male terminals 35 of the male terminal unit 30 are each inserted. The male terminal 35 of the male terminal unit 30 is formed in plural up and down in a predetermined pattern and is fixed by the male connector 31.

The insertion groove 11 is formed at the other side of the housing 10 provided with the male insertion hole 17 and the female terminal 20 is inserted into the insertion groove 11.

Figure 4:
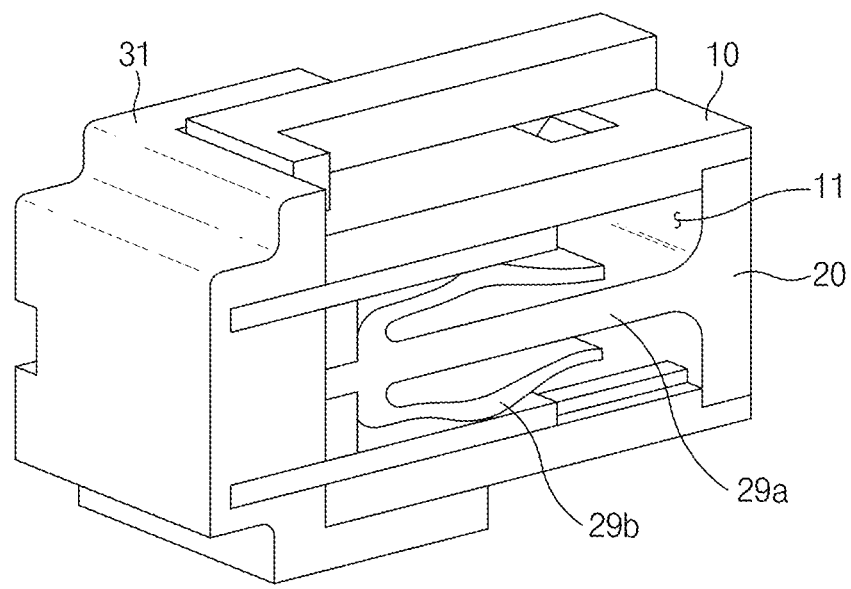
FIG. 4 is a diagram illustrating a section of the coupling of the female connector according to the exemplary form of the present disclosure with the male terminal unit.

The outer fastening hole 15 is formed at a position adjacent to the male insertion hole 17. As illustrated in FIG. 4, the outer fastening hole 15 is to fix the coupling with the female terminal 20 inserted into the insertion groove 11 and is formed between the male insertion holes 17 which are formed vertically in a predetermined pattern. The outer fastening hole 15 may be formed in plural to improve a bonding strength with the female terminal 20.

The upper fastening hole 13 is penetratedly formed on the housing 10. The upper fastening member 25 of the female terminal 20 to be described below is inserted into the upper fastening hole 13 to fix the coupling of the housing 10 with the female terminal 20.

The female terminal 20 includes a body 29 to be coupled with the housing 10, a pattern part 23 formed on a surface of the body 29 and electrically connected to the male connector 31 by activating the surface by a laser, an outer fastening member 27 to be coupled with the outer fastening hole 15, and an upper fastening member 25 to be fastened with the upper fastening hole 13.

Figure 5:
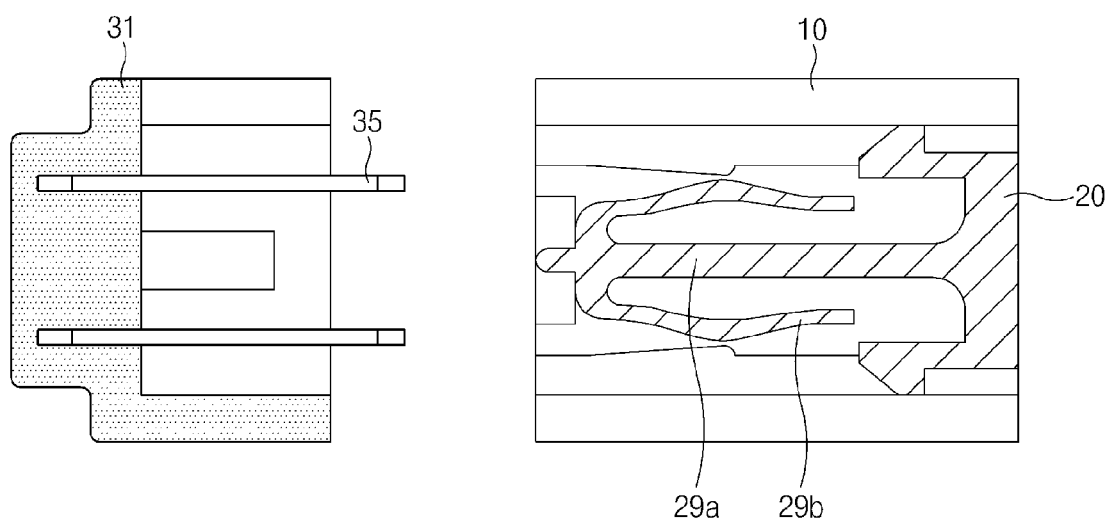
FIGS. 5 to 7 are diagrams a section according to an order of the coupling of the female connector according to the exemplary form of the present disclosure with the male terminal unit.
Figure 6:
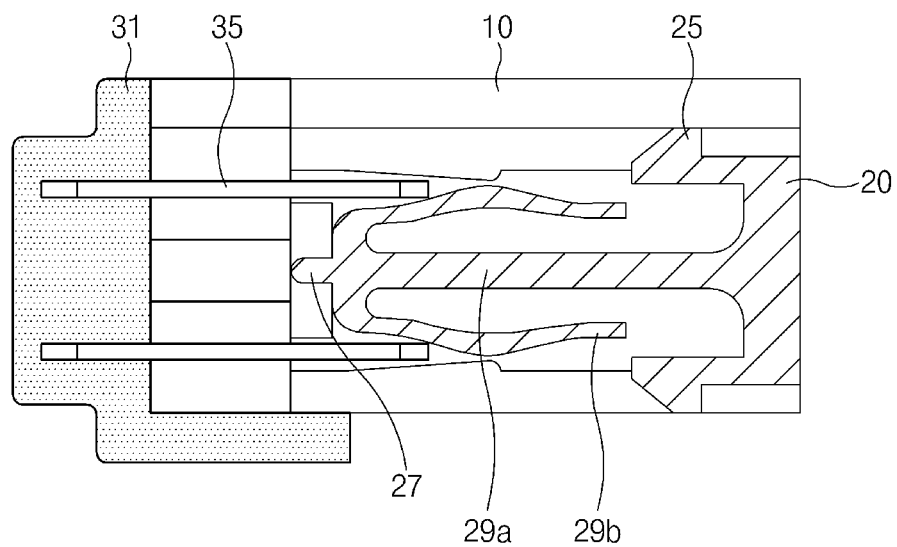
Figure 7:
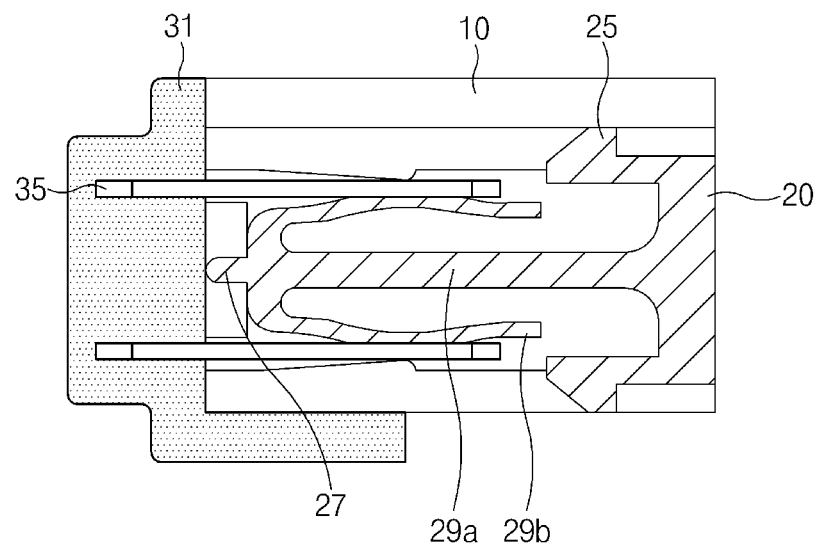
Figure 8:
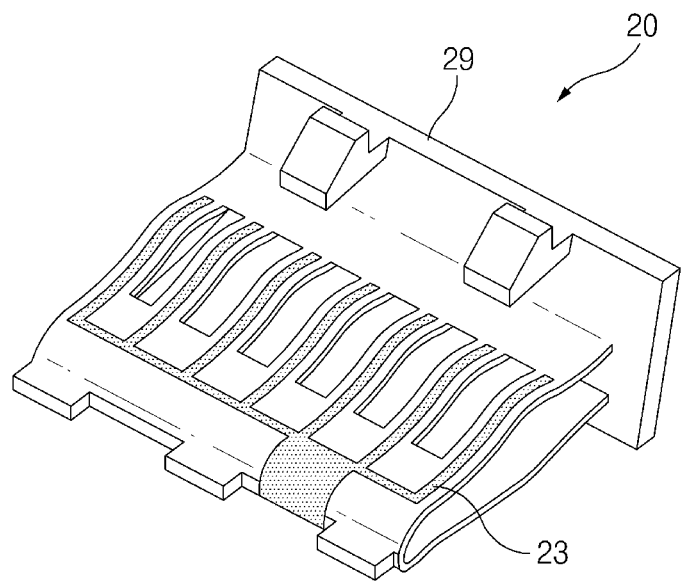
FIGS. 8 to 10 are a diagram illustrating an example of the female connector according to the exemplary form of the present disclosure.
Figure 8:
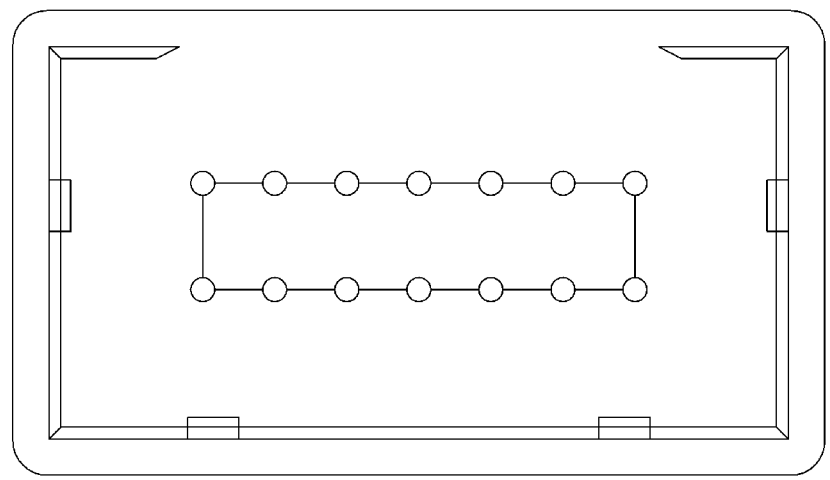

The body 29 of the female terminal 20 includes a main body 29a extending along the insertion direction based on the insertion direction in which the female terminal 20 is inserted into the insertion groove 11 and a wing body 29b protruding to the outside from a front toward a rear based on the insertion direction. That is, as illustrated in FIG. 5, when viewing a section of the female terminal 20, the main body 29a forms a center in the middle of the female terminal 20 and both sides thereof are provided with the wing body 29b, based on the main body 29a. The wing body 29b is bent to protrude from a front toward a rear based on the insertion direction and has an elastic force toward the outside. By this configuration, when the female terminal 20 is inserted into the housing 10, the wing body 29b is deformed toward an inside by the male terminal 35 of the male terminal unit 30 coupled with the housing 10 and the fastening is fixed.

Figure 9:
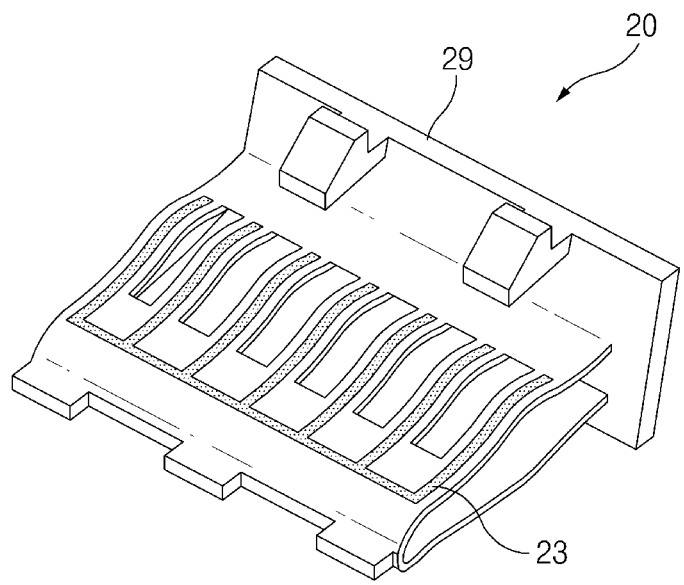
Figure 9:
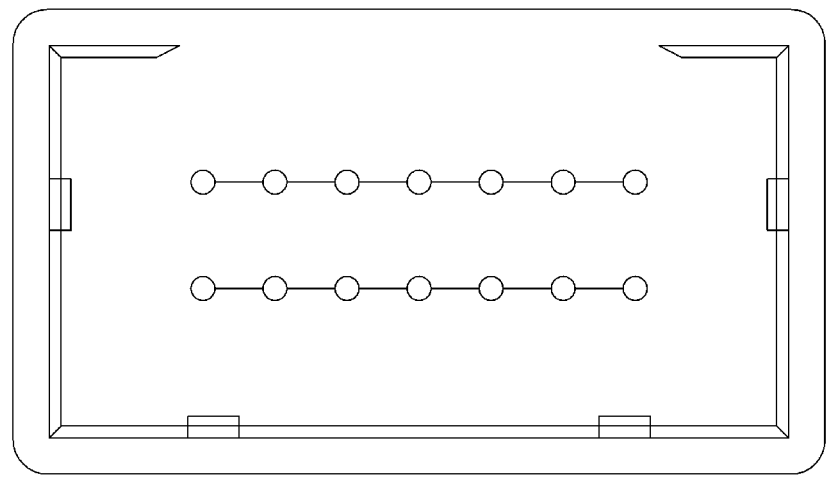
Figure 10:
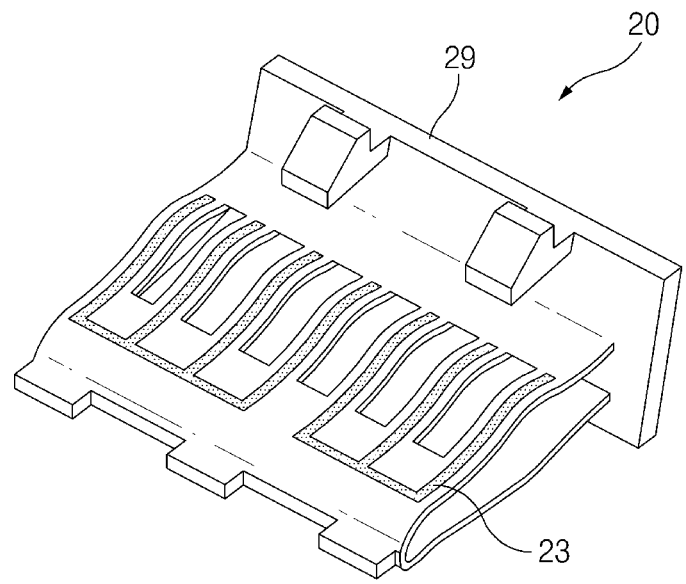
Figure 10:
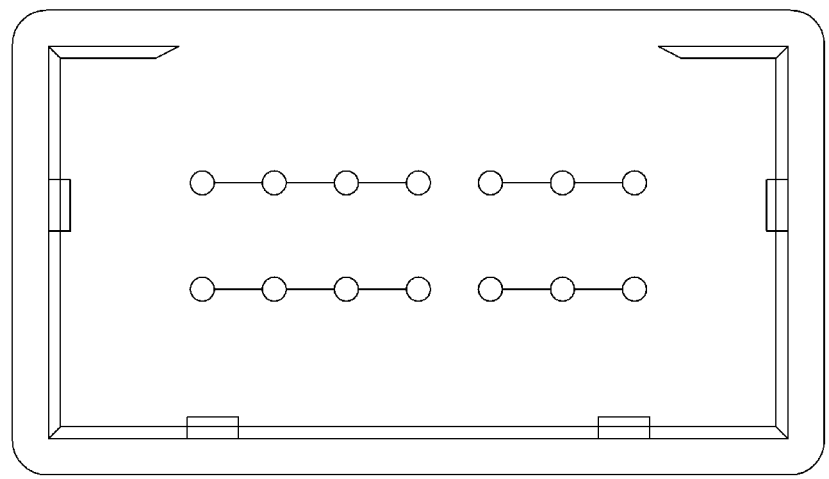
Figure 11:
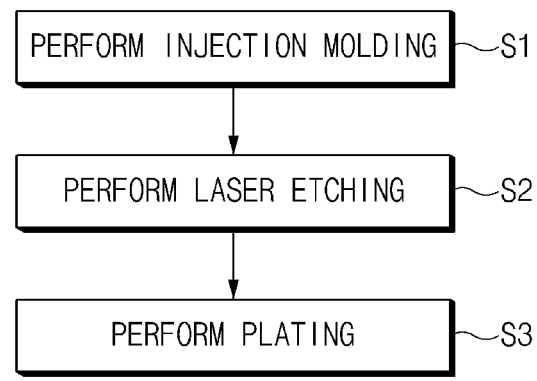
FIG. 11 is a diagram illustrating a flow chart of a method for manufacturing a female connector according to an exemplary form of the present disclosure.

The pattern part 23 plated with a metal pattern is formed on the wing body 29b. The pattern part 23 is provided on the wing body 29b by activating the electrically connectable pattern using a laser direct structure (LDS) method. When the female terminal 20 is inserted into the housing 10, the pattern part 23 is electrically connected to the male terminal 35 of the male terminal unit 30. As illustrated in FIGS. 9 to 11, the circuit pattern of the pattern part 23 may be provided in various shapes, if necessary. After a laser pattern is etched on the wing body 29b, the pattern part 23 is formed by plating any one of nickel, copper, and gold thereon.

Meanwhile, to fix the coupling of the housing 10 with the female terminal 20, the female terminal 20 is provided with the outer fastening member 27 which is fastened with the outer fastening hole 15 of the housing 10 and the upper fastening member 25 which is fastened with the upper fastening hole 13 of the housing 10.

The outer fastening member 27 is positioned at a front based on the insertion direction into the insertion groove 11 of the female terminal 20 and protrudes from the body 29 to be fastened with the outer fastening hole 15 of the housing 10 at the time of being inserted into the insertion groove 11. The outer fastening member 27 is provided in plural to improve the bonding strength and is provided at a shape and a position corresponding to the outer fastening hole 15.

The upper fastening member 25 is formed on the housing 10, protruding from the body 29 and is fastened with the upper fastening hole 13 of the housing 10 at the time of being inserted into the insertion groove 11 of the female terminal 20.

The coupling of the female terminal 20, the housing 10, and the male terminal unit 30 which are provided as described above will be described. First, the female terminal 20 is inserted into the insertion groove 11 of the housing 10. The housing 10 and the female terminal 20 are fastened with the outer fastening member 27 which protrudes from the front of the body 29 of the female terminal 20, the outer fastening hole 15 which is penetratedly formed on the housing 10, and the outer fastening member protrudes outside the housing 10. Further, the upper fastening hole 13 penetratedly formed on the housing is fastened with the upper fastening member 25 which protrudes from above the body 29 of the female terminal 20 and the upper fastening member 25 fastened with the upper fastening hole 13 penetratedly formed on the housing 10 protrudes outside the housing 10. When the coupling of the female terminal 20 with the housing 10 is fixed, the male terminal unit 30 is coupled through the male insertion hole 17 which is formed at one side of the housing 10 (see FIG. 6). The male terminals 35 of the male terminal unit 30 are formed in a predetermined pattern and are fixed to ends of the plurality of male cables 33 by the male connector 31. The male terminal 35 of the male terminal unit 30 is inserted into the male insertion hole 17 and is fastened with the female terminal 20 in the housing 10. Meanwhile, the wing body 29b provided with the pattern part 23 of the female terminal 20 is elastically deformed inward by the male terminal 35 and the inter-terminal fastening is fixed (see FIG. 8).

<Method for Manufacturing Female Connector>

Figure 12:
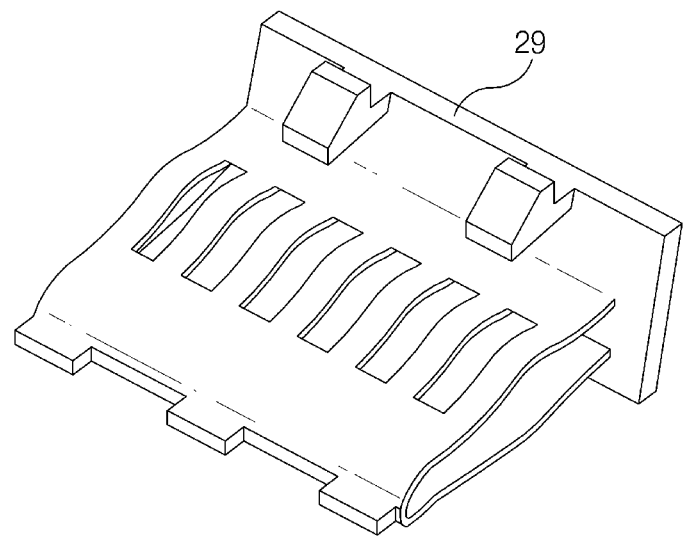
FIG. 12 is a diagram illustrating an injection molding process in the method for manufacturing a female connector according to an exemplary form of the present disclosure.
Figure 13:
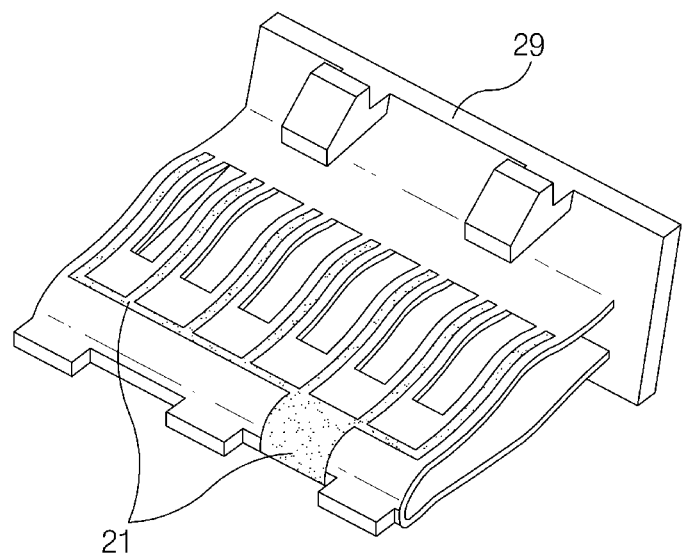
FIG. 13 is a diagram illustrating a laser etching process in the method for manufacturing a female connector according to an exemplary form of the present disclosure.
Figure 14:
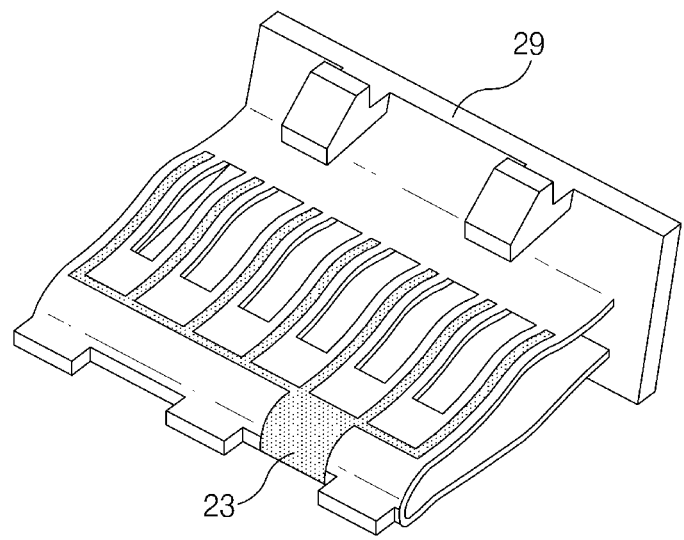
FIG. 14 is a diagram illustrating a plating process in the method for manufacturing a female connector according to an exemplary form of the present disclosure.

Hereinafter, a method for manufacturing a female connector according to an exemplary form of the present disclosure will be described with reference to the accompanying drawings. As illustrated in FIGS. 12 to 14, the method for manufacturing a female connector according to an exemplary form of the present disclosure includes injection molding the body 29, laser etching the circuit pattern on the body 29, and plating a laser pattern.

As illustrated in FIG. 12, the injection molding is plastic injection molding the body 29 to meet design specifications.

As illustrated in FIG. 13, the laser etching is etching the circuit pattern by irradiating a laser to the circuit pattern on the body 29. In the laser etching, a laser etching groove is formed on the body 29 by etching the circuit pattern in various patterns depending on the required circuit.

As illustrated in FIG. 14, in the plating, any one of copper, nickel, and gold is plated on the laser etching groove to form the pattern part 23. According to the method for manufacturing a female connector as described above, the female connector may be manufactured by a simpler process than the related art, thereby saving costs and facilitating mass production.

As described above, according to the exemplary forms of the present disclosure, it is possible to provide the female connector and the method for manufacturing the same capable of more reducing the number of manufacturing processes than the related art to save costs, implementing the mass production, and reducing the size and weight of products.

It is to be understood that the above-mentioned exemplary forms are illustrative rather than being restrictive in all aspects, and the scope of the present disclosure will be defined by the claims to be described below rather than the above-mentioned detailed description. In addition, all modifications and alternations derived from the claims and their equivalents are to be interpreted to be included in the scope of the present disclosure.

What is claimed is:

1. A female connector coupled with a male terminal unit, the female connector comprising:
    a housing having one side provided with a male insertion hole into which the male terminal unit is inserted and other side provided with an insertion groove;
    a body configured to be inserted into the insertion groove to be coupled with the housing; and
    a female terminal formed on a surface of the body and provided with a pattern part electrically connected to a male connector,
    wherein the surface of the body is laser-deposed,
    wherein a plurality of outer fastening holes are penetratedly formed at a position adjacent to the male insertion hole of the housing, and
    the female terminal further includes an outer fastening member which protrudes from the body and is fastened with at least one of the plurality of outer fastening holes to couple with the housing,
    wherein an upper fastening hole is penetratedly formed on the housing, and
    the female terminal further includes an upper fastening member which protrudes from the body and is fastened with the upper fastening hole to couple with the housing.

2. The female connector according to claim 1, wherein the body of the female terminal is made of a metal composite in which a laser-deposed portion has conductivity and a non-laser-decomposed portion has insulation.

3. The female connector according to claim 1, wherein the body of the female terminal comprises:
    a main body extending along an insertion direction of the female terminal, and
    a wing body protruding to an outside from a front toward a rear relative to the insertion direction, and
    a pattern part is formed on the wing body.

4. The female connector according to claim 3, wherein the wing body is provided to have an elastic force toward the outside.

5. A female connector comprising:
    a housing having one side provided with a male insertion hole into which a male terminal unit is inserted and other side provided with an insertion groove; and
    a female terminal coupled with the housing by being inserted into the insertion groove,
    wherein the female terminal comprises a body on which a pattern is formed, and the pattern is configured to electrically connect to a male connector,
    wherein a plurality of outer fastening holes are penetratedly formed at a position adjacent to the male insertion hole of the housing, and
    the female terminal further includes an outer fastening member which protrudes from the body and is fastened with the outer fastening hole to couple with the housing,
    wherein an upper fastening hole is penetratedly formed on the housing, and
    the female terminal further includes an upper fastening member which protrudes from the body and is fastened with the upper fastening hole to couple with the housing.

6. The female connector according to claim 5, wherein the body comprises a main body forming a center in the middle of the female terminal, and a wing body is provided on both sides of the main body, extending outwardly from the sides of the main body.

* * * * *